(12) United States Patent
Liaw

(10) Patent No.: US 9,564,433 B2
(45) Date of Patent: Feb. 7, 2017

(54) SEMICONDUCTOR DEVICE WITH IMPROVED CONTACT STRUCTURE AND METHOD OF FORMING SAME

(71) Applicant: Taiwan Semiconductor Manufacturing Company, Ltd., Hsin-Chu (TW)

(72) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/617,467

(22) Filed: Feb. 9, 2015

(65) Prior Publication Data

US 2015/0221642 A1    Aug. 6, 2015

Related U.S. Application Data

(63) Continuation of application No. 11/775,039, filed on Jul. 9, 2007, now Pat. No. 8,952,547.

(51) Int. Cl.

| H01L 27/088 | (2006.01) |
| H01L 21/768 | (2006.01) |
| H01L 21/321 | (2006.01) |
| H01L 29/06 | (2006.01) |
| H01L 29/66 | (2006.01) |

(Continued)

(52) U.S. Cl.
CPC ....... *H01L 27/088* (2013.01); *H01L 21/32115* (2013.01); *H01L 21/768* (2013.01); *H01L 21/76895* (2013.01); *H01L 21/823425* (2013.01); *H01L 21/823437* (2013.01); *H01L 21/823475* (2013.01); *H01L 23/485* (2013.01); *H01L 23/528* (2013.01); *H01L 27/11* (2013.01); *H01L 27/1104* (2013.01); *H01L 29/0649* (2013.01); *H01L 29/66568* (2013.01); *H01L 23/522* (2013.01); *H01L 23/5226* (2013.01); *H01L 23/5283* (2013.01); *H01L 27/0207* (2013.01); *H01L 2924/0002* (2013.01)

(58) Field of Classification Search
CPC .................................................. H01L 23/4855
See application file for complete search history.

(56) References Cited

U.S. PATENT DOCUMENTS

| 5,055,423 A | 10/1991 | Smith et al. |
| 6,239,491 B1 | 5/2001 | Pasch et al. |

(Continued)

FOREIGN PATENT DOCUMENTS

| CN | 1540767 | 10/2004 |

OTHER PUBLICATIONS

Chinese Patent Office, Office Action dated Mar. 21, 2011, Application No. 200810008642.0, 6 pages.

*Primary Examiner* — Phat X Cao
*Assistant Examiner* — Diana C Vieira
(74) *Attorney, Agent, or Firm* — Haynes and Boone, LLP

(57) ABSTRACT

A contact structure includes a first contact formed in a first dielectric layer connecting to the source/drain region of a MOS transistor, and a second contact formed in a second dielectric layer connecting to a gate region of a MOS transistor or to a first contact. A butted contact structure abutting a source/drain region and a gate electrode includes a first contact formed in a first dielectric layer connecting to the source/drain region of a MOS transistor, and a second contact formed in a second dielectric layer with one end resting on the gate electrode and the other end in contact with the first contact.

20 Claims, 18 Drawing Sheets

(51) Int. Cl.
*H01L 21/8234* (2006.01)
*H01L 23/485* (2006.01)
*H01L 23/528* (2006.01)
*H01L 27/11* (2006.01)
*H01L 27/02* (2006.01)
*H01L 23/522* (2006.01)

(56) References Cited

U.S. PATENT DOCUMENTS

| | | |
|---|---|---|
| 6,724,085 B2 | 4/2004 | Tomita |
| 6,822,330 B2 | 11/2004 | Park et al. |
| 2004/0043550 A1 | 3/2004 | Chakihara et al. |
| 2004/0245576 A1 | 12/2004 | Enders et al. |
| 2006/0019488 A1 | 1/2006 | Liaw |
| 2007/0023917 A1 | 2/2007 | Yamada |
| 2007/0069307 A1 | 3/2007 | Eda |
| 2007/0128848 A1 | 6/2007 | McDevitt et al. |
| 2009/0014796 A1 | 1/2009 | Liaw |

SEMICONDUCTOR DEVICE WITH IMPROVED CONTACT STRUCTURE AND METHOD OF FORMING SAME

PRIORITY DATA

This application is a continuation application of U.S. patent application Ser. No. 11/775,039, filed Jul. 9, 2007, which is incorporated herein by reference in its entirety.

TECHNICAL FIELD

The present invention relates generally to semiconductor integrated circuits, and more particularly, to semiconductor devices having improved contact structure.

BACKGROUND

Contacts are typically vertical metal interconnect structures formed in an integrated circuit that connect the diffusion regions and gate electrodes of a semiconductor device to the first layer of interconnect. Individual semiconductor devices formed in a semiconductor substrate are usually electrically coupled to each other through contacts in order to form functional integrated circuits. The desired characteristics of a contact include a minimum contact resistance, ease of fabrication, and good reliability.

FIG. 1 shows a cross sectional view of a semiconductor device employing the conventional self-aligned silicide, tungsten plug contact configuration. In forming this prior art contact structure, after the creation of transistors is complete, a silicide layer 5 is deposited and patterned atop the source/drain and gate regions of MOS transistors, such as s1, d1, g1 of MOS transistor m1, s2, d2, g2 of MOS transistor m2 and g3 of another MOS transistor (not shown). Silicide layer 5 is used to reduce the resistance of the source/drain diffusion regions in the substrate 2 and the gate electrodes. A dielectric layer (ILD) is then typically formed atop the substrate 2 and polished through a planarization process to form a flat surface. Photoresist is generally deposited and patterned, and a dry etch process is usually employed to cut holes through the ILD where contacts are desired. Chemical vapor deposition (CVD) tungsten may then be used to fill in the contact holes. Another planarization process may be employed to remove tungsten residues on the substrate and create a flat substrate surface for subsequent processing steps. As shown in FIG. 1, contacts thus formed may include regular, square-shaped contacts 8 landing on an area in the source/region or gate region of MOS transistor m1 and m2. The contacts may also include rectangular-shaped contact 10, having a much larger size than regular contact 8. Contact 10 rides across two conductive regions on a substrate, such as the source region s2 of transistor m2 and the gate electrode g3 of another MOS transistor (not shown), having a configuration generally referred to as a butted contact (BTC). BTC contact 10 abuts two conductive regions and can significantly reduce the number of contacts needed. In general, BTC contacts are used in making electrical connections to a die area where high device density is desired, such as an embedded SRAM and DRAM cell area, thus, reducing the die area and enhancing device reliability.

FIG. 2 illustrates the layout view of the device in FIG. 1 with prior art contacts added. In FIG. 2, two contacts 8 having a minimum design-rule size are used in each of the source region s1 and drain region d1 of the transistor m1. As recognized in the art, a contact with a minimum design rule size exhibits a high overall yield and reliability while occupying the smallest possible silicon area. Contact 8 has a square-shape with an edge dimension of "λ." Two square-shaped contacts 8 are connected to the drain region d2 of the transistor m2. Two BTC contacts 10 are used to couple the source region s2 of m2 and the gate electrode g3 of another MOS transistor (not shown).

However, as transistor dimensions continue to scale down in advanced processing technology, this and other prior art contact structures begin to limit device performance in various ways. First, further feature size scaling can lead to contacts with very large aspect ratio (i.e., contact depth versus contact width), close to 10:1 under some circumstances. Cutting contact openings having an aspect ratio of this level will typically take a much longer time, compared with the dry etch process used in forming the contact openings in the prior art. A detrimental effect known as "striation" may also occur on the surface region between adjacent contact holes due to severe photoresist losses on the edges of the contact openings during the long plasma etch process. "Striation" causes electrical shorting between adjacent contacts and may cause severe device yield loss. This problem is compounded by the increased contact opening density on a wafer surface processed using advanced technology.

Second, in forming a contact, a tapered contact opening profile is usually preferred to provide desired step coverage by the metal that is filled into it. However, a tapered contact opening with a very large aspect ratio may result in a substantially reduced contact landing area on the source/drain region and gate electrode. This may, in turn, lead to a substantial increase in contact resistance and deteriorated device performance.

Third, the contact openings are aligned with the source/drain region and gate electrode through a separate photolithography step. Due to the shrunken device feature sizes, the margin for a misalignment between the contact openings and the source/drain region and gate electrode is significantly reduced in advanced technology. A reduced margin for misalignment may cause substantial device yield loss or create serious device reliability concerns, especially in a butted contact area, where a misalignment may easily cause a complete disconnection to a diffusion region or a gate electrode.

In view of these and other problems in the prior art contact structures used in an existing semiconductor device, there is a need for improved contact structures and methods of forming the same in order to cope with the continuous trend of device scaling and maintain the desired characteristics, such as low contact resistance, ease of making and highly reliable.

SUMMARY OF THE INVENTION

These and other problems are generally solved or circumvented, and technical advantages are generally achieved, by preferred embodiments of the present invention which provide a contact structure where a contact to a MOS transistor comprises a first contact formed in a first dielectric layer, in contact with a source/drain region, and a second contact formed in a second dielectric layer, connecting to a gate region or a preformed first contact. A butted contact structure abutting a source/drain of a first transistor and the gate region of a second transistor comprises a first contact formed in a first dielectric layer, in contact with a source/drain region of the first transistor, and a second contact formed in a second dielectric layer, having one end resting on the gate electrode of the second transistor and the other end in contact with the preformed first contact. The advantageous features of the contacts in preferred embodiments include reduced aspect ratio and reduced contact density, which may lead to improved process window and enhanced device yield.

In accordance with a preferred embodiment of the present invention, a contact structure of a MOS transistor comprises a first contact formed within and substantially co-planar with a first dielectric layer on a semiconductor substrate, wherein said first contact is in contact with a source/drain region of said MOS transistor, a second contact formed within and substantially co-planar with a second dielectric layer formed over the first dielectric layer, wherein said second contact overlaps said first contact, and a third contact formed at least partially within and substantially co-planar with a top surface of the second dielectric layer, wherein said third contact is in contact with a gate region of said MOS transistor.

In accordance with another preferred embodiment of the present invention, a butted contact structure for MOS transistors comprises a first contact formed within and substantially co-planar with a first dielectric layer on a semiconductor substrate, wherein said first contact is in contact with a source/drain region of a first MOS transistor, and a second contact formed at least partially within and substantially co-planar with a top surface of a second dielectric layer formed over the first dielectric layer, wherein said second contact overlaps said first contact at one end, and in contact with a gate electrode of a second MOS transistor at the other end.

In accordance with a further preferred embodiment of the present invention, a semiconductor SRAM unit cell comprises a first PMOS pull-up transistor including a drain coupled to a high voltage supply node, a source coupled to a first storage node, and a gate coupled to a second storage node, a first NMOS pull-down transistor including a drain coupled to a low voltage supply node, a source coupled to a first storage node, and a gate coupled to the second storage node, a second PMOS pull-up transistor including a drain coupled to a high voltage supply node, a source coupled to a second storage node, and a gate coupled to a first storage node, a second NMOS pull-down transistor including a drain coupled to a low voltage supply node, a source coupled to a second storage node, and a gate coupled to the first storage node, a first dielectric layer formed over the first PMOS and NMOS transistors, the second PMOS and NMOS transistors, a first local interconnect electrically coupling the source of the first PMOS, the source of the first NMOS, the first local interconnect formed within and substantially co-planer with the first dielectric layer, a second local interconnect electrically coupling the source of the second PMOS, the source of the second NMOS, the second local interconnect formed within and substantially co-planer with the first dielectric layer, a second dielectric layer formed over the first dielectric layer, the first local interconnect and the second local interconnect, a third local interconnect over the first local interconnect, electrically coupling the first local interconnect and the gates of the second PMOS and NMOS, the third local interconnect formed at least partially within and substantially co-planer with a top surface of the second dielectric layer, and a fourth local interconnect over the second local interconnect, electrically coupling the second local interconnect and the gates of the first PMOS and NMOS, the fourth local interconnect formed at least partially within and substantially co-planer with the top surface of the second dielectric layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an improved contact structure and the method of forming the same. This inventive contact structure comprises a first type connecting to the source/drain regions of MOS transistors, having a bottom and top portion. The contact structure also comprises a second type connecting to either the contacts of the first type or gate electrodes of MOS transistors. This contact structure exhibits the desired contact characteristics for the advanced technology generation. The process of forming the embodied contact structures does not involve adding complex, error-prone processing steps. To clarify description and avoid repetition, like numerals and letters used to describe the prior art in FIGS. 1-2 will be used for the various elements in the coming figures. Also, reference numbers described in FIGS. 1-2 may not be described again in detail herein.

Figure 3:
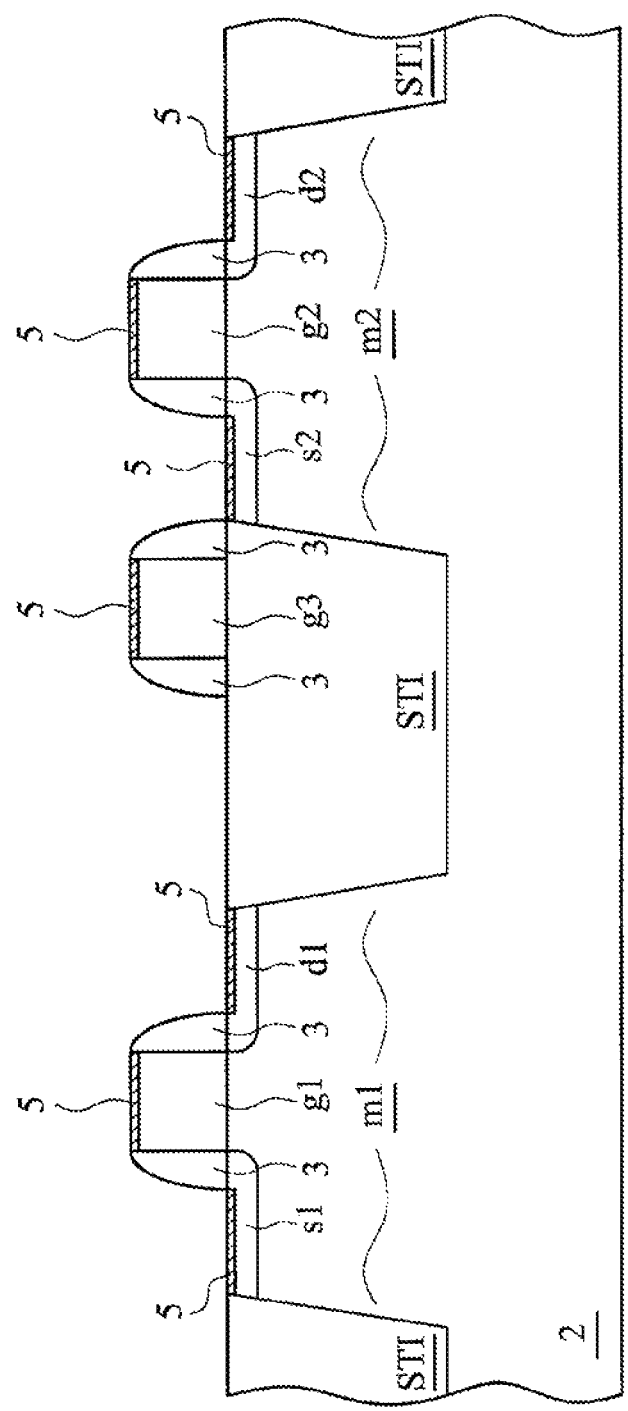
FIGS. 3, 4, 5A, 5B, 6A, 6B, 7A, and 7B show the cross sectional and layout views of various processing steps in forming a semiconductor device according to the principles of one embodiment of the current invention.

Starting with FIG. 3, a semiconductor substrate 2 is provided. In a preferred embodiment, substrate 2 is a silicon substrate with a desired doping concentration. In other embodiments, substrate 2 may be a silicon germanium, gallium arsenide, compound semiconductor, multi-layers semiconductor, silicon on insulator (SOI), germanium on insulator (GeOI), and the like. At the desired region in the semiconductor substrate 2, MOS transistors m1 and m2 have been formed by known materials and processes, having source/drain regions and gate electrodes of s1, d1, g1, and s2, d2, g2, respectively. Gate electrode g3 of a third MOS transistor (not shown) has been formed atop shallow trench isolation (STI) region between m1 and m2, abutting source region s2 of m2. In one preferred embodiment, gate electrodes g1, g2, g3 include a polysilicon layer (not shown) formed over a gate oxide layer (not shown). In other preferred embodiments, gate electrodes g1, g2, g3 may include a metal gate electrode formed over a gate dielectric layer with high dielectric constant (k). Gate electrodes g1, g2, g3 may also include spacers 3 covering the corners between gate electrode sidewalls and substrate 2. In preferred embodiments, silicide layer 5 may be formed on the top of the gate electrodes g1, g2, g3 and source/drain regions s1/d1, s2/d2 of MOS devices m1 and m2 by a known silicide process, in order to reduce the resistance of the gate electrodes and diffusion regions. The silicide is preferably $NiSi_2$, $CoSi_2$, $TiSi_2$, or the like.

MOS transistors m1 and m2 are electrically isolated from each other and other adjacent devices (not shown) by STIs formed in the semiconductor substrate 2. Preferably, the STIs are formed by etching shallow trenches in substrate 2, and filling the trenches with an insulator such as silicon dioxide ($SiO_2$). From hereafter, "semiconductor substrate" is used to refer to the starting semiconductor substrate 2, while "substrate" is used to refer to a finished wafer surface after an intermediate process step in a preferred embodiment.

Figure 4:
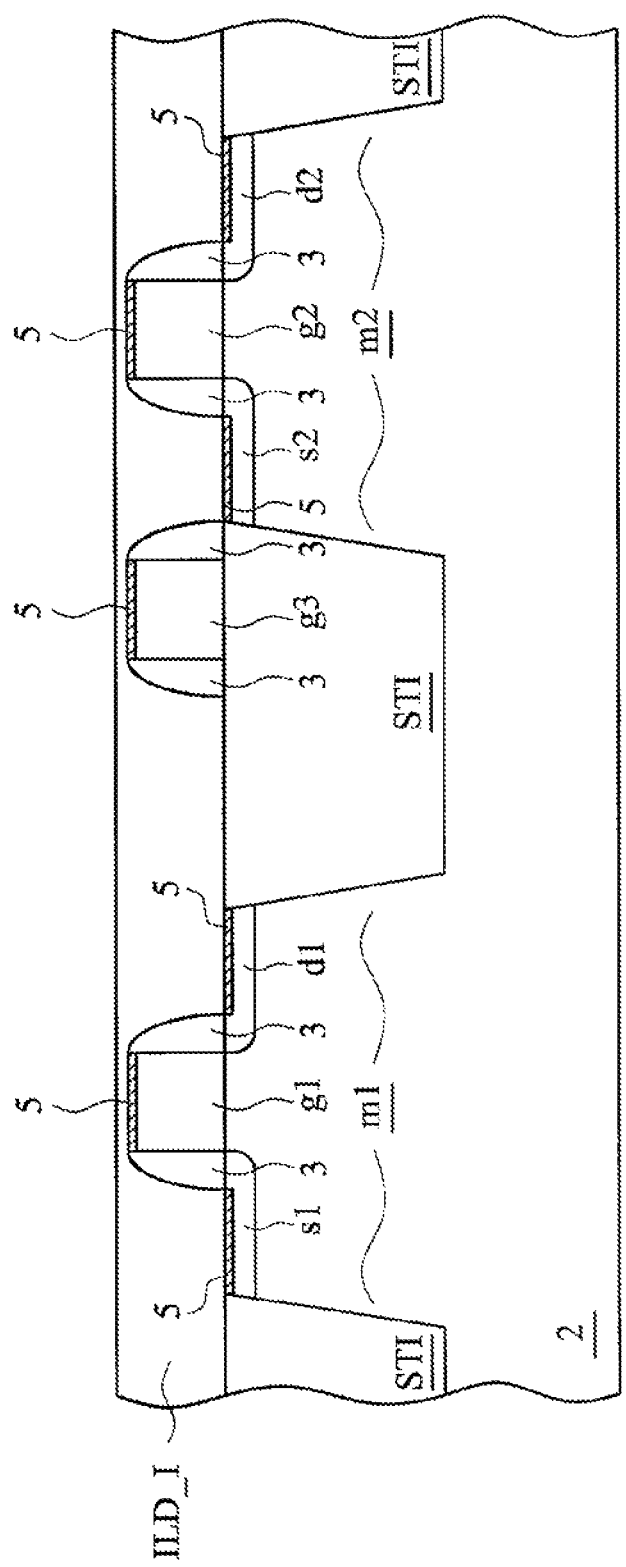

Shown in FIG. 4, a first dielectric layer ILD_I is formed atop the semiconductor substrate 2. In a preferred embodiment, ILD_I is a CVD $SiO_2$ layer. In other preferred embodiments, ILD_I may be a silicon nitride (e.g., $Si_3N_4$, $SiN_x$) layer, although other suitable dielectric materials and processes are not excluded. A known planarization process, such as a chemical mechanical polishing (CMP), is applied on the substrate surface to remove the excess ILD_I dielectric material and form a flat surface. In one preferred embodiment, the completed ILD_I layer has a thickness of about 1500 Å, which is about one and one-half times the thickness of the gate electrodes g1, g2 and g3. In other preferred embodiments, the completed wafer surface has an ILD_I layer of from about 500 Å to about 1100 Å, approximately 50-100 Å thicker than the gate electrodes g1, g2, and g3. The thin ILD_I layer left on the top of the electrodes protects the underlying silicide layer 5 from being damaged in the subsequent process steps. In a further embodiment, completed ILD_I layer has a thickness substantially the same as that of the gate electrodes, such that g1, g2 and g3 are substantially co-planar with ILD_I. In even further additional and/or alternative embodiments, the thickness of ILD_I is such that the contact openings created therein have an aspect ratio of less than 4:1.

Alternatively, prior to the formation of ILD_I layer, a strain-induced layer (not shown) made of materials such as silicon nitride, oxynitride, oxide, silicon germanium, or any combinations of such materials can be formed atop a PMOS transistor by known processes, generating compressive strain in the PMOS channel region, thus, enhancing PMOS device performance. In a similar manner, a strain-induced layer (not shown) made of materials such as silicon nitride, oxynitride, oxide, SiC, SiCN, SiON, $CoSi_2$ (Co silicide), $NiSi_2$ (Ni silicide), or any combinations of such materials can be formed atop an NMOS transistor by known processes, generating tensile strain in the NMOS channel region, thus enhancing NMOS device performance. In a preferred embodiment, the thickness of the strain-induced layer is at least three times the minimum design rule gate polysilicon width. In another preferred embodiment, ILD_I has a multi-layers configuration, comprising at least a silicon oxide and a silicon nitride layer. In an additional embodiment, low k (dielectric contact) materials are used for ILD_I.

Figure 5A:
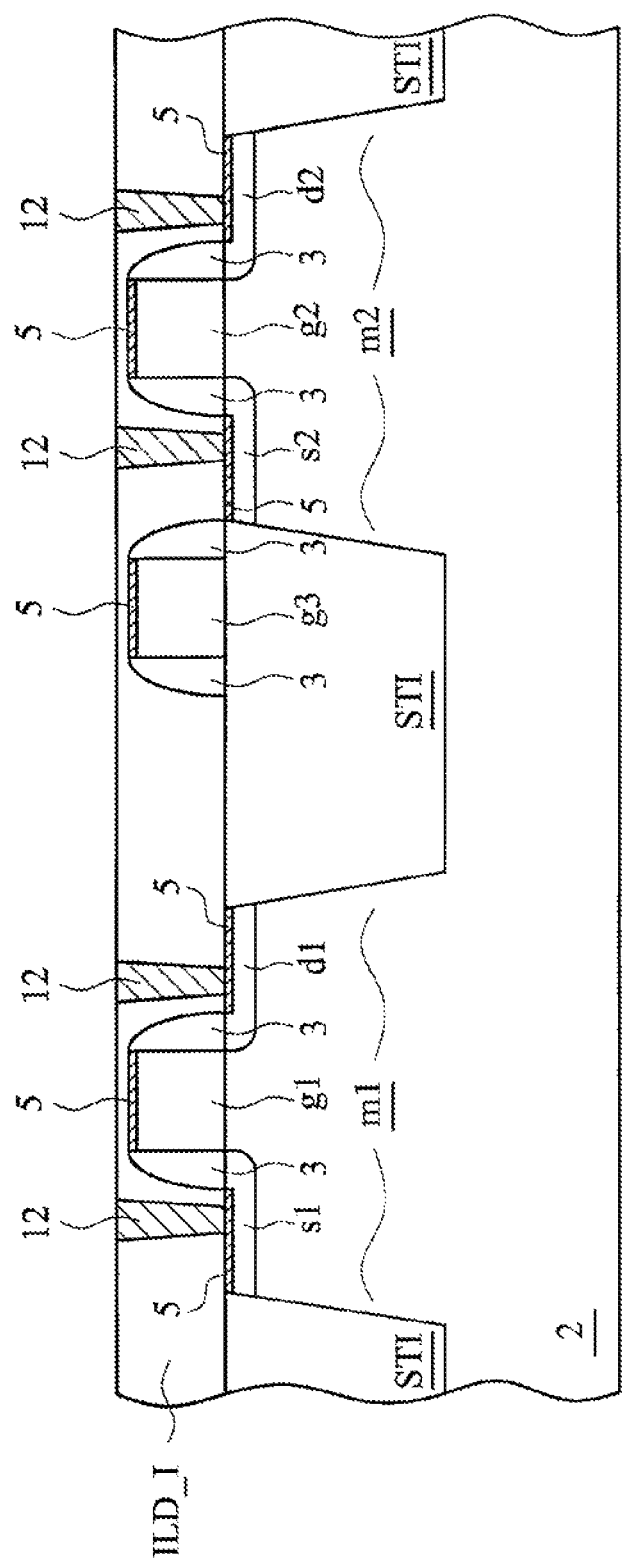
Figure 5B:
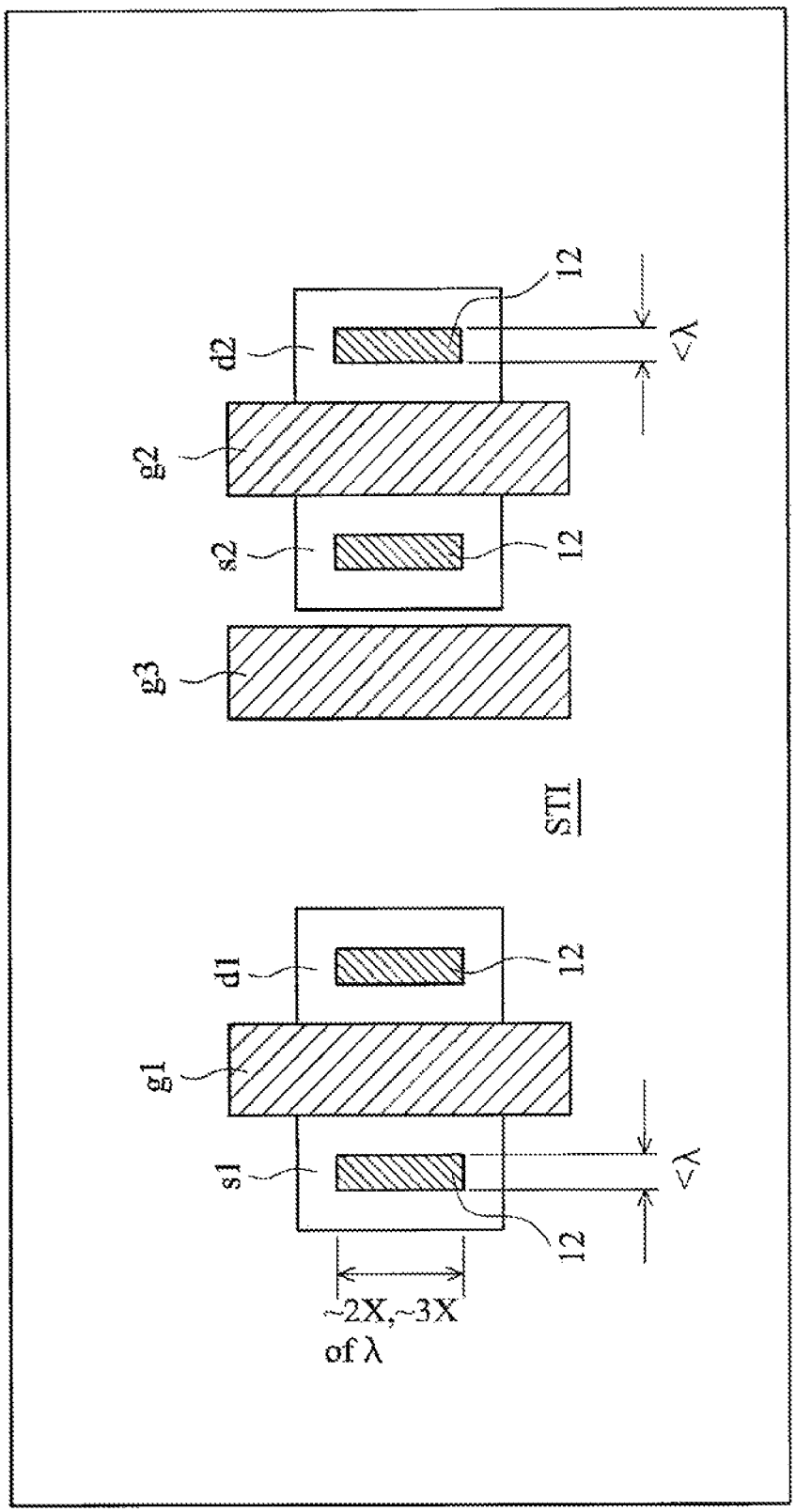

Continuing in FIG. 5A, a first photomask MSK_I (not shown), defining the contact openings to source/drain regions s1/d1, s2/d2 of MOS transistors m1, m2 is developed. A known photolithography process may be used to transfer MSK_I contact pattern to ILD_I layer on the substrate. A known etch process, such as an anisotropic plasma etch process, can be performed after the lithography to remove unwanted ILD_I material and form contact openings in ILD_I. Afterward, a CVD tungsten may be filled in the contact openings by a known process to form tungsten plug contacts 12. A known planarization process, such as CMP, is applied on the substrate surface to remove the excess tungsten and provide a flat surface for the subsequent process steps. When these processing steps are completed, every source/drain region s1/d1, s2/d2 of MOS transistors m1, m2 is connected to one of contacts 12. Contacts 12 thus formed in the ILD_I layer are generally referred to as CONT1 from hereinafter. The device layout view after the current processing step is illustrated in FIG. 5B.

It should be noted that in additional and/or alternative embodiments, contact materials may be selected from Cu, W, Al, AlCu, Ni, Co, TiN, TiW, Ti, TaN, Ta, other metal nitrides, or any combination thereof.

Several advantageous features of CONT1 formed as above bear noting. First, unlike the contact structure used in the prior art device described in FIGS. 1-2, where multiple square-shaped contacts 8, each having a minimum design-rule size, are used in the source/drain regions, CONT1 in the current embodiment has a rectangular shape as shown in FIG. 5B. Its longitudinal axis (length) is parallel to the channel width direction. In one preferred embodiment, its width (i.e., its dimension along the channel length direction) has a minimum design-rule contact dimension "λ," while its length (i.e., its dimension along the channel width direction) is at least two and one-half times "λ." Moreover, a single contact is preferably used in a source/drain region of a MOS transistor.

In another preferred embodiment, its width may be slightly smaller than "λ," while its length may be at least two and one-half times "λ." The current CONT1 configuration provides additional space for a further device scaling along the device channel length direction. In either embodiment, the increased contact area in the source/drain region, due to the preferred CONT1 configuration, may lead to improved device performance. In a preferred embodiment, a photoresist re-coating process is employed to form contact openings having a narrower-than-design-rule edge.

Figure 1:
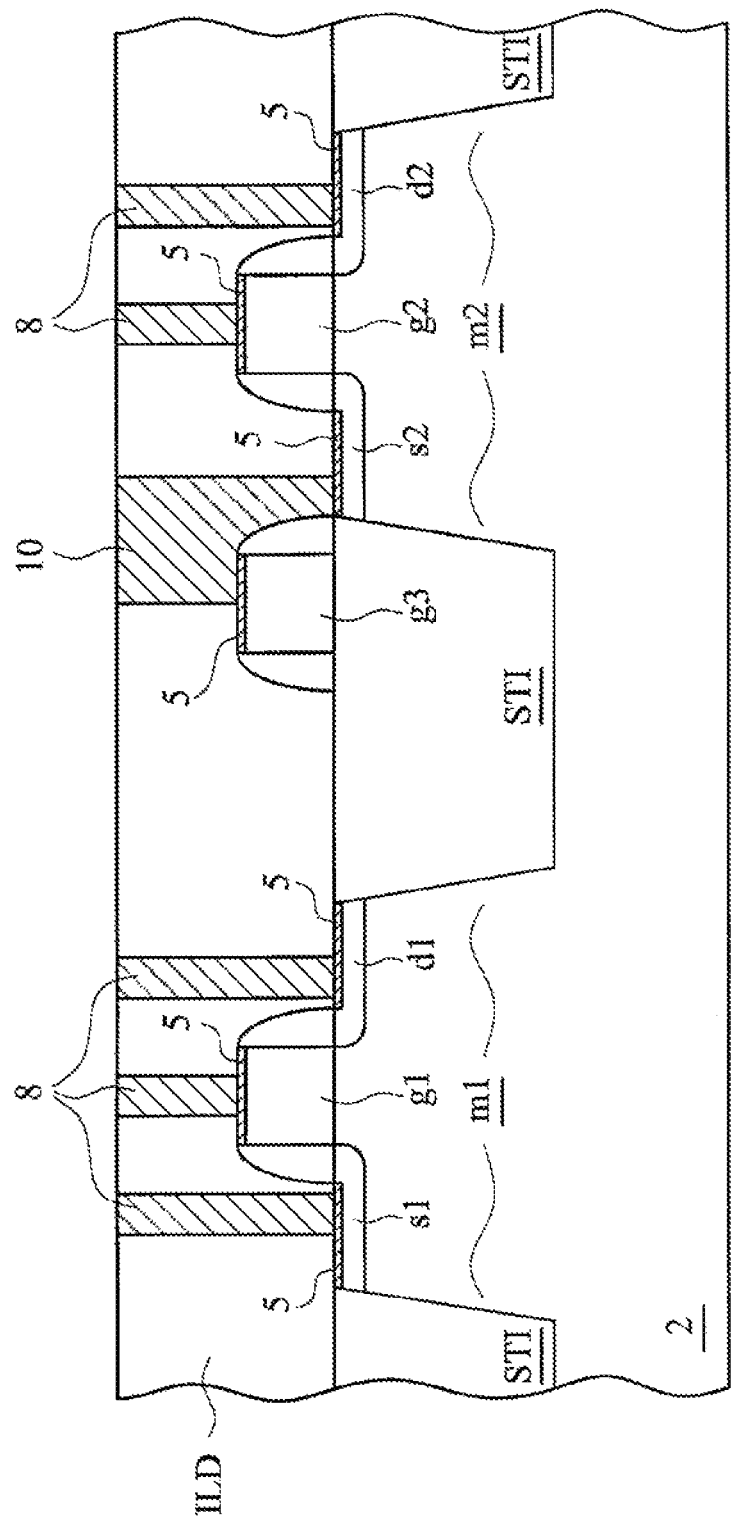
FIG. 1 is a cross sectional view of a semiconductor device having a prior art contact structure.
Figure 2:
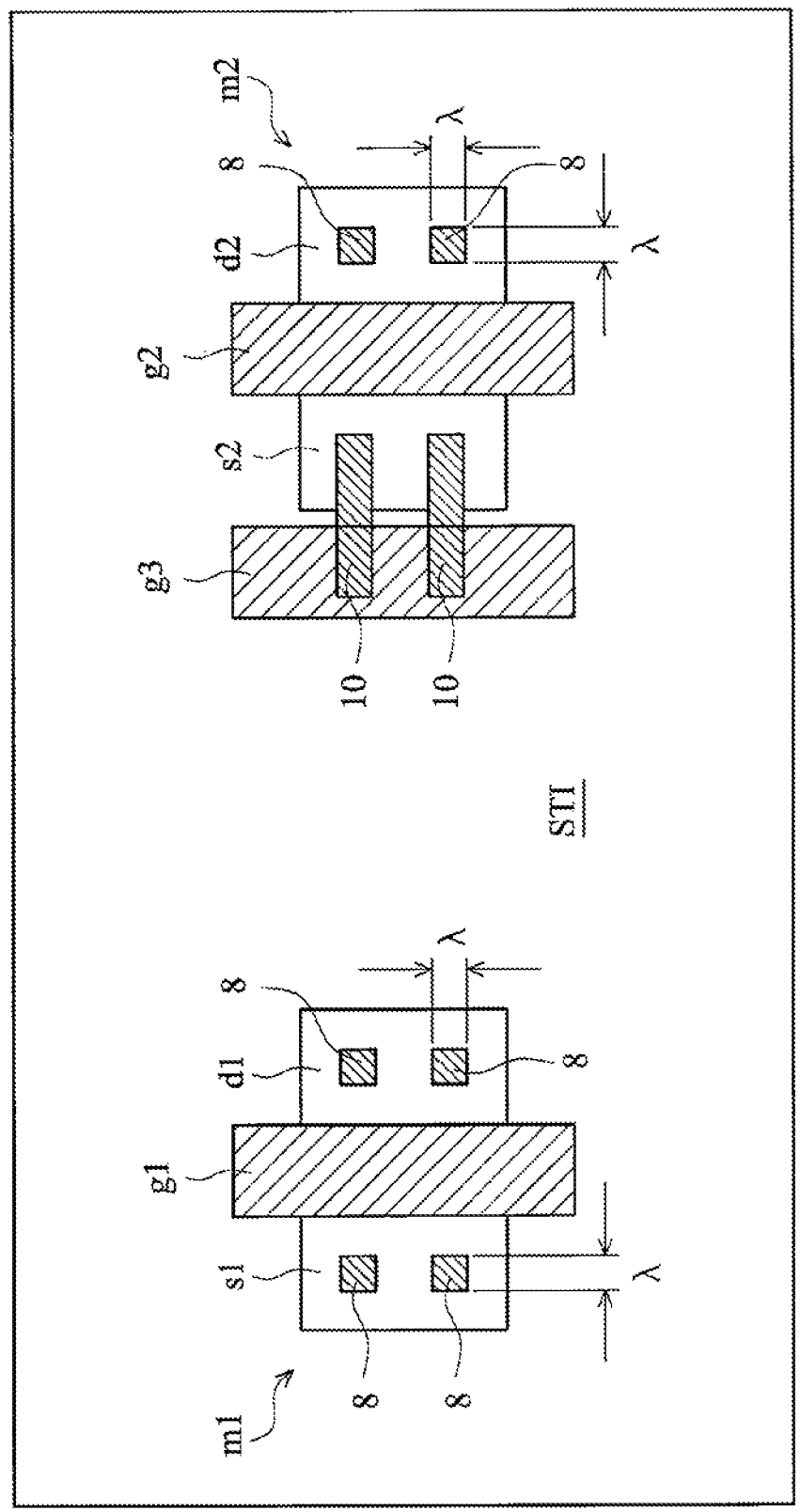
FIG. 2 is the layout view of the semiconductor device shown in FIG. 1.

Second, the aspect ratio of CONT1 is significantly smaller than that of contacts 8 in the prior art as shown in FIG. 1. The etch process used in forming CONT1 openings will have an improved process window and thus, the desired large contact area in the source/drain region can be readily obtained. Third, the density of contact openings is significantly reduced due to the fact that only contact openings in the source/drain are created during the current processing step. Thus, the detrimental effect of contact striation can be avoided. These advantageous features also provide an improved margin for a misalignment on contact openings, since no BTC openings are formed at this stage.

Figure 6A:
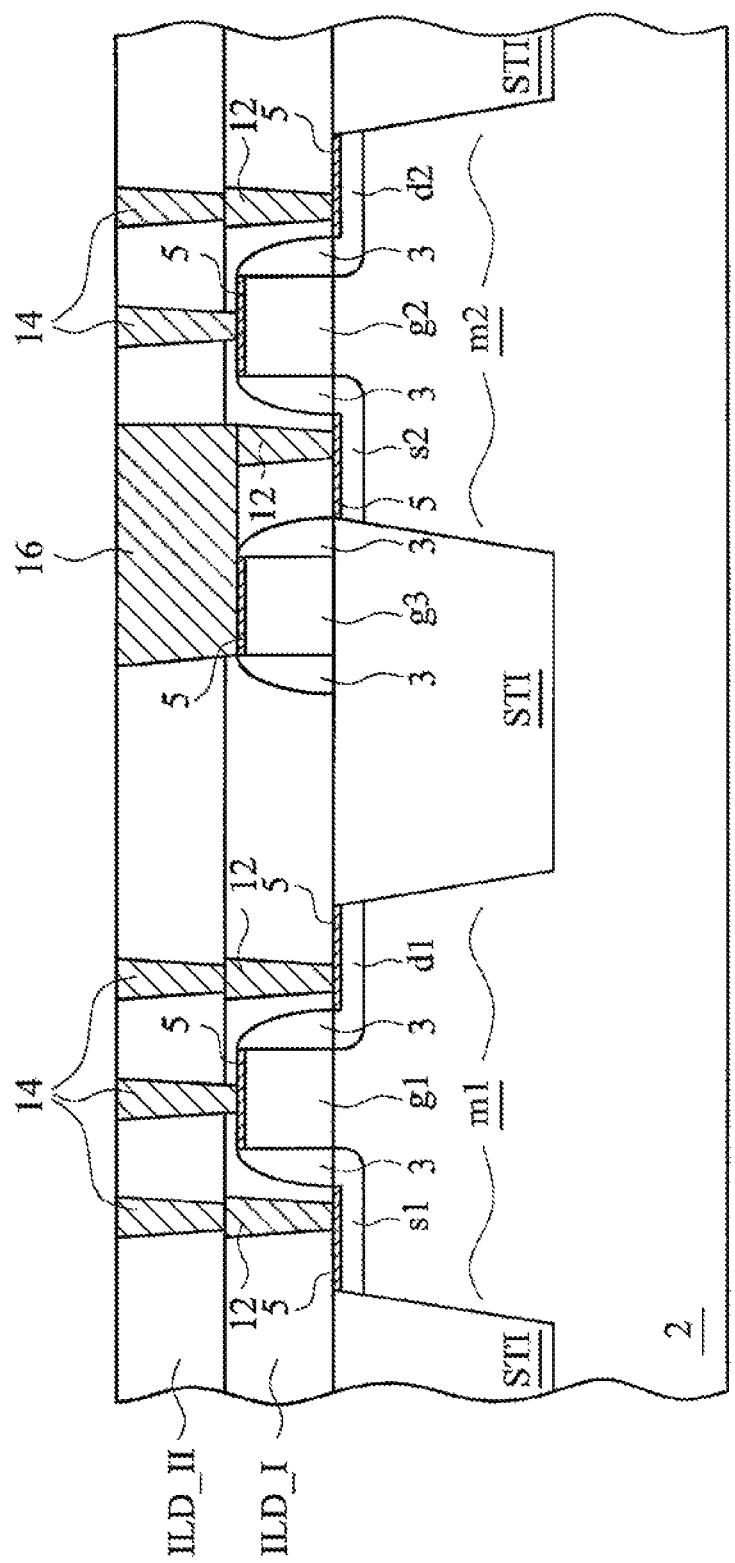

Turning now to FIG. 6A, a second dielectric layer ILD_II is formed atop the substrate. In a preferred embodiment, ILD_II is made of the same dielectric material used in forming the first dielectric layer IDL_I, such as a CVD $SiO_2$, and silicon nitride through a similar known deposition process. In another preferred embodiment, ILD_II is a low k dielectric material. However, it should be noted that ILD_II formed by other suitable dielectric materials and processes are not excluded from the various embodiments of the present invention. In a preferred embodiment, ILD_II has a thickness of from about 500 Å to about 3000 Å. In other preferred embodiments, ILD_II may have a thickness larger than 100 Å. In further preferred embodiments, the thickness of ILD_II is less critical, so long as contact openings created therein will not have an aspect ratio larger than 4.5:1. In an even further embodiment, ILD_II has a multi-layer configuration, comprising at least a silicon oxide and a silicon nitride layer. In an additional embodiment, low k (dielectric contact) materials are used for ILD_II.

After forming ILD_II, a second photomask MSK_II (not shown) is developed, defining the contact openings to the earlier formed CONT1 in ILD_I and gate electrodes g1, g2, g3 of MOS transistors formed in semiconductor substrate 2. A known photolithography process may be used to transfer the MSK_II contact pattern to ILD_II layer. A known etch process, such as an anisotropic plasma etch process, is performed after the lithography to remove unwanted ILD_II material and form contact openings in ILD_II. A known CVD process is used to fill tungsten in the contact openings to form tungsten plugs 14 and 16 as shown in FIG. 6A. Contact 14 is a regular, square-shaped contact, preferably having a minimum design-rule size. In source/drain region s1/d1, s2/d2 of MOS transistors m1, m2, contact 14 is formed stacking on the top surface of earlier formed contact 12 in ILD_I. In the gate region of a MOS transistor, such as g1, g2 of m1 and m2, contact 14 makes direct contacts with a gate electrode. Further, forming contact 14 to an earlier formed contact 12 and gate electrode in ILD_I involves cutting through ILD_II layer and any of ILD_I layer left on gate electrodes g1, g2 from the earlier processing steps. In places where an electrical connection to two adjacent conductive regions, such as g3 and s2, is needed, a rectangular-shaped contact 16 is formed with one end resting on gate electrode g3 of a MOS transistor (not shown), and the other end stacking on contact 12 formed in ILD_I. In preferred embodiments, the dry etch process of forming contact openings involves an over etch period of about 20% in order to assure complete removal of ILD_II and any of ILD_I left at the bottom of the openings for forming contacts 14, 16. This exposes the top surface of CONT1 and gate electrodes g1, g2, g3 to form contacts 14 and 16. To simplify description, contacts 14 and 16 thus formed are generally referred to as CONT2 hereinafter.

It should be noted that in additional and/or alternative embodiment of the present invention, copper may be used to form CONT2. In further alternative embodiments, contact materials are selected from Cu, W, Al, AlCu, Ni, Co, TiN, TiW, Ti, TaN, Ta, other metal nitrides or any combination thereof, although other suitable contact materials are not excluded from the various embodiments of the present invention. A known planarization process such as CMP is applied on the substrate surface to remove excess contact filling materials (e.g., tungsten, copper, and the like) and provide a flat surface for the subsequent process steps. In preferred embodiments, a conductive barrier layer (not show), such as 50-100 Å Ti (titanium), TiN (titanium nitride), Ta (tantalum), TaN (tantalum nitride), or the like layer may be formed by a known process on the bottom of CONT2 openings prior to the filling of conductive contact material. A barrier layer thus formed can prevent the contact materials, such as copper, from diffusing into ILD_I and ILD_II dielectric layers. Such a barrier layer can also avoid detrimental effects, such as electromigration, from happening, thus, improving device reliability.

Figure 6B:
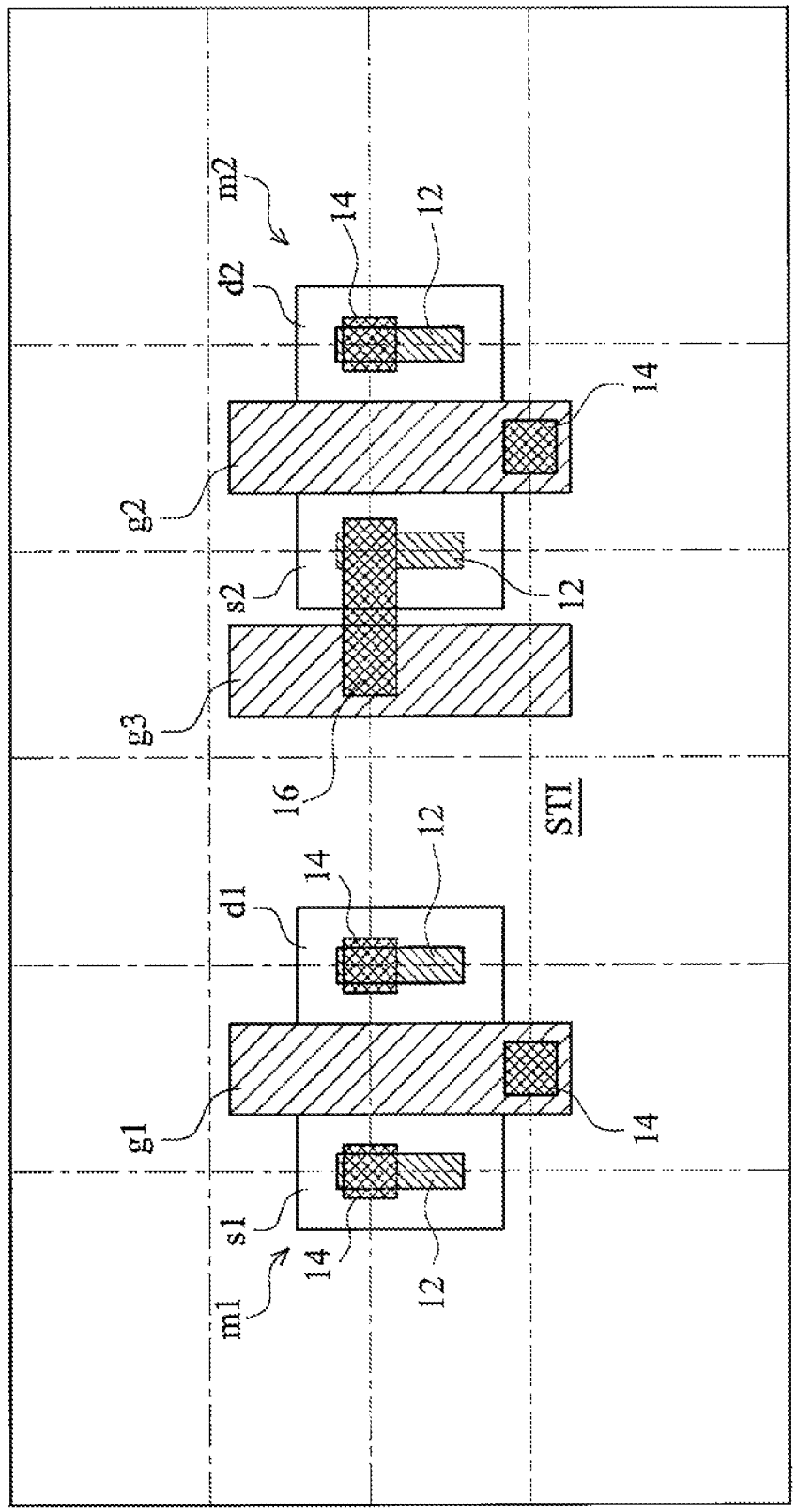

FIG. 6B illustrates the device layout view after the current process step. Extra measures have been taken in forming the current CONT2 configuration. First, as described above, in source/drain s1/d1, s2/d2 and gate region g1, g2, where no butted contacts are required, CONT2 14 is formed having a generally squared shape with a minimum design-rule size. Second, as an extra constraint posed at the design layout stage, CONT2 are placed on equally spaced virtual grids having a pitch size substantially the same as the minimum design-rule contact-to-contact space (dashed mesh in FIG. 6B), and CONT2 on adjacent grids are preferably placed in a staggered orientation from each other. Third, when a rectangular-shaped, BTC CONT2 16 is needed, it longitudinal axis is perpendicular to that of CONT1 connecting to it. These and other measures facilitate a desired high CONT2 density, while keeping the CONT2-to-CONT2 space substantially larger than the minimum design-rule space.

Figure 7A:
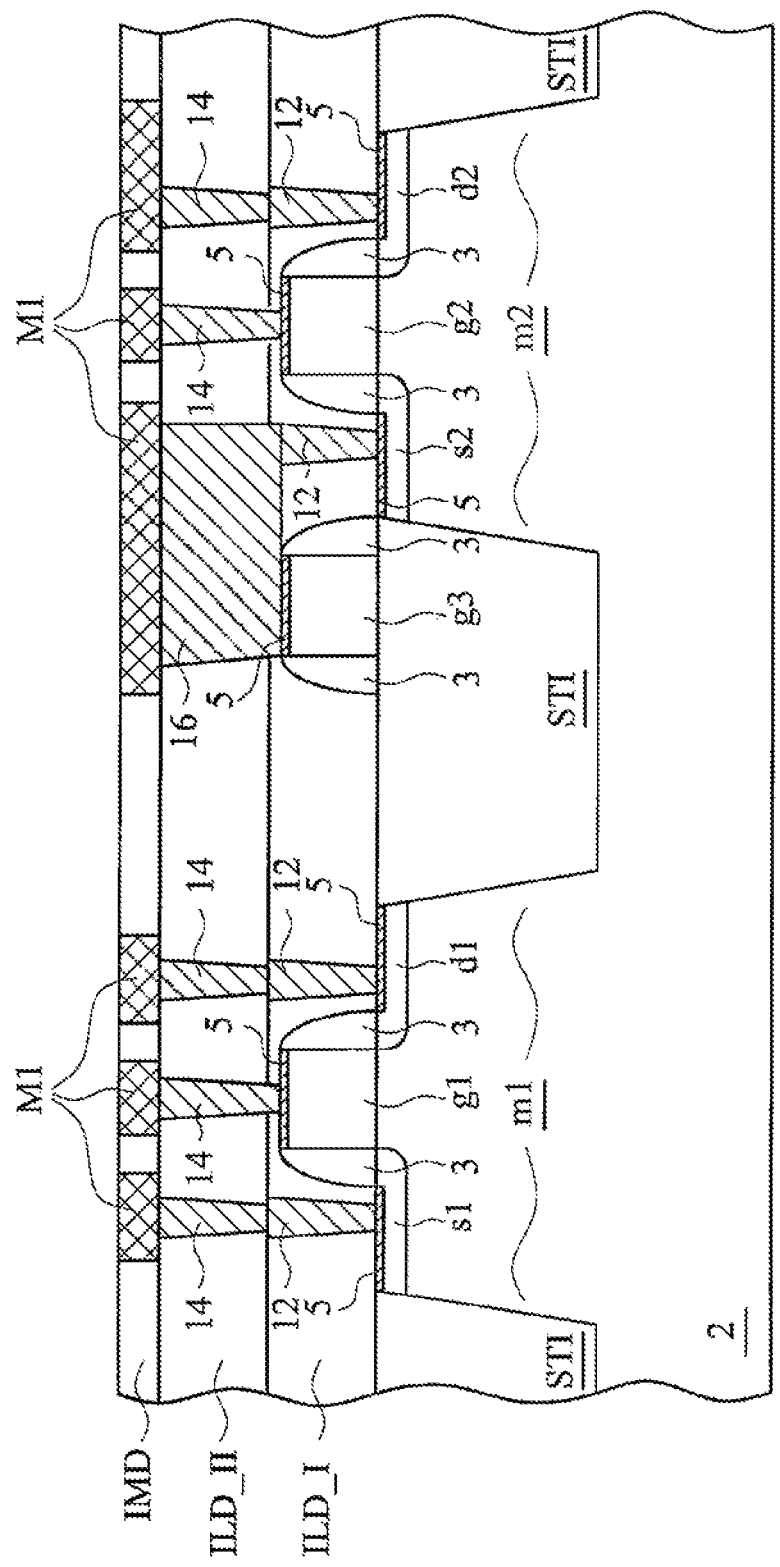

After the formation of contacts 14 and 16, a metal suitable for the first layer of interconnect (M1), such as aluminum, copper, or the like is deposited on the substrate by a known process. A known photolithography and etch process is employed to pattern and form M1 wires. Alternatively, a single damascene process can be employed in forming M1 wires. In doing so, an additional dielectric layer, IMD, is added by a known CVD process atop ILD_II. Known photolithography and etch processes are used to form trenches in IMD. A known metal deposition process can then be applied onto the wafer, forming the M1 wires. In forming trenches in IMD, an over etch period of about 20% is allowed to assure complete removal of IMD and any of ILD_II left at the bottom of the trenches, thus, exposing the top surface of CONT2 for forming M1 wires. A polishing step, such as CMP, removes the M1 outside the trenches. FIG. 7A illustrates the cross-sectional view after M1 formation.

Figure 7B:
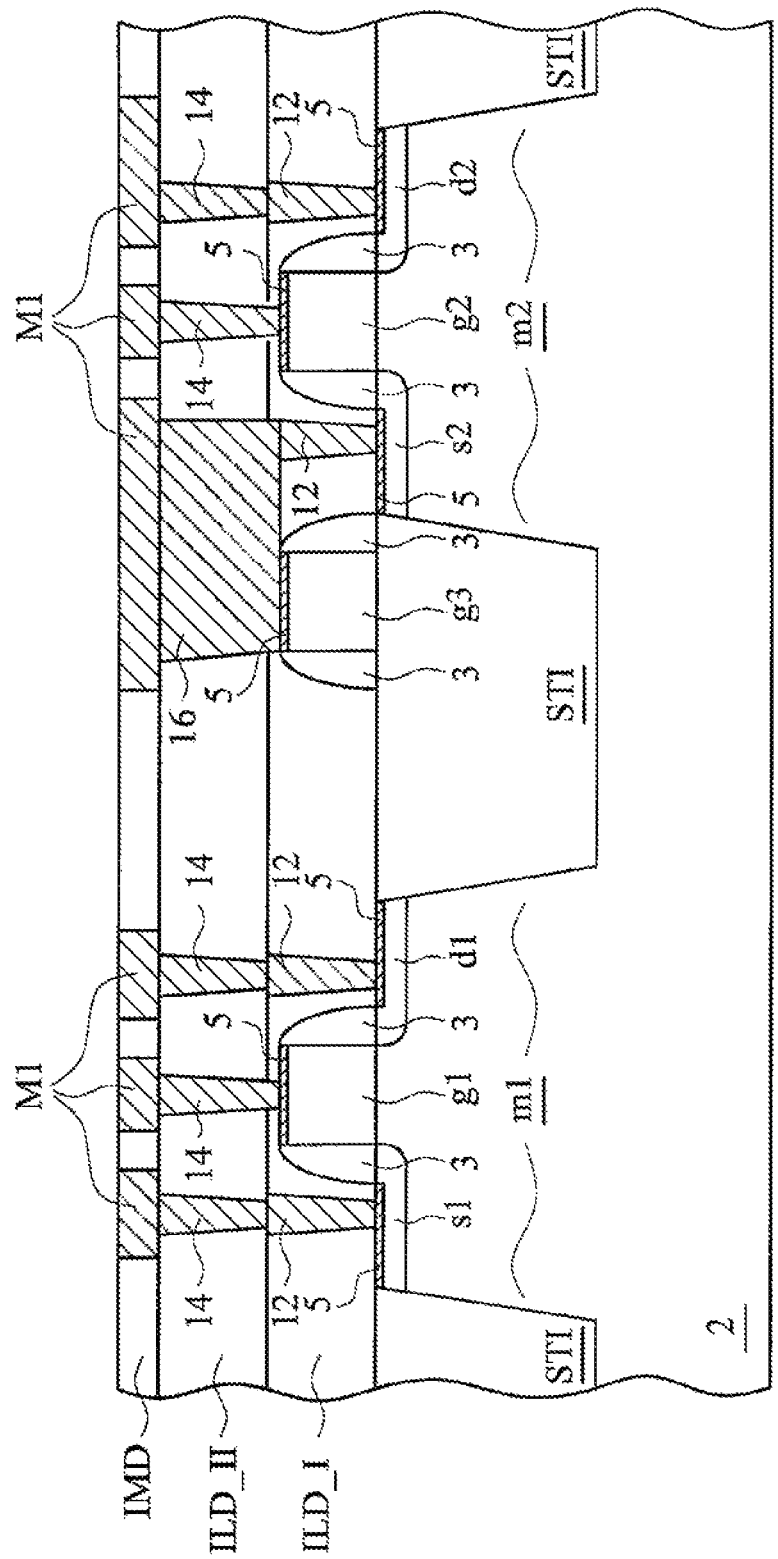

When using copper for CONT2 and M1 wires, a known dual damascene process may be employed to form CONT2 and M1 wires simultaneously, thus, reducing processing cost and enabling more conductive layers in the integrated circuit. In a preferred embodiment, another dielectric layer, IMD, is added by a known CVD process after the formation of ILD_II. Known photolithography and etch processes are used to form CONT2 openings in ILD_II and trenches for M1 filling in IMD. A known copper deposition process, such as CVD or electroplating is applied onto the wafer, forming copper CONT2 and M1 wires simultaneously. A polishing step, such as CMP removes the copper outside the trenches. A semiconductor device after these processing steps is shown in FIG. 7B.

Upon the completion of above processing steps, the electrical connection between MOS transistors m1, m2 in the semiconductor substrate and the first interconnect layer are provided by contacts of different structures. Contact to source/drain region s1/d1, d2 of MOS transistor m1, m2 each comprises square-shaped, minimum design-rule size contact 14 formed in ILD_II, stacking on rectangular-shaped contact 12 formed in ILD_I. Contact to the gate electrode g1, g2 of MOS transistor m1, m2 each comprises square-shaped, minimum design-rule size contact 14 formed in ILD_II. The BTC contact connecting to source region s2 of MOS transistor m2 and electrode g3 of another MOS transistor (not shown) comprises rectangular-shaped contact 12 formed in ILD_I, connecting to source region s2, and rectangular-shaped contact 16 formed in ILD_II, with one end resting on gate electrode g3 and the other end in contact with contact 12 on source region s2. Preferably, the longitudinal axis of contact 16 and contact 12 is perpendicular to each other.

Figure 8A:
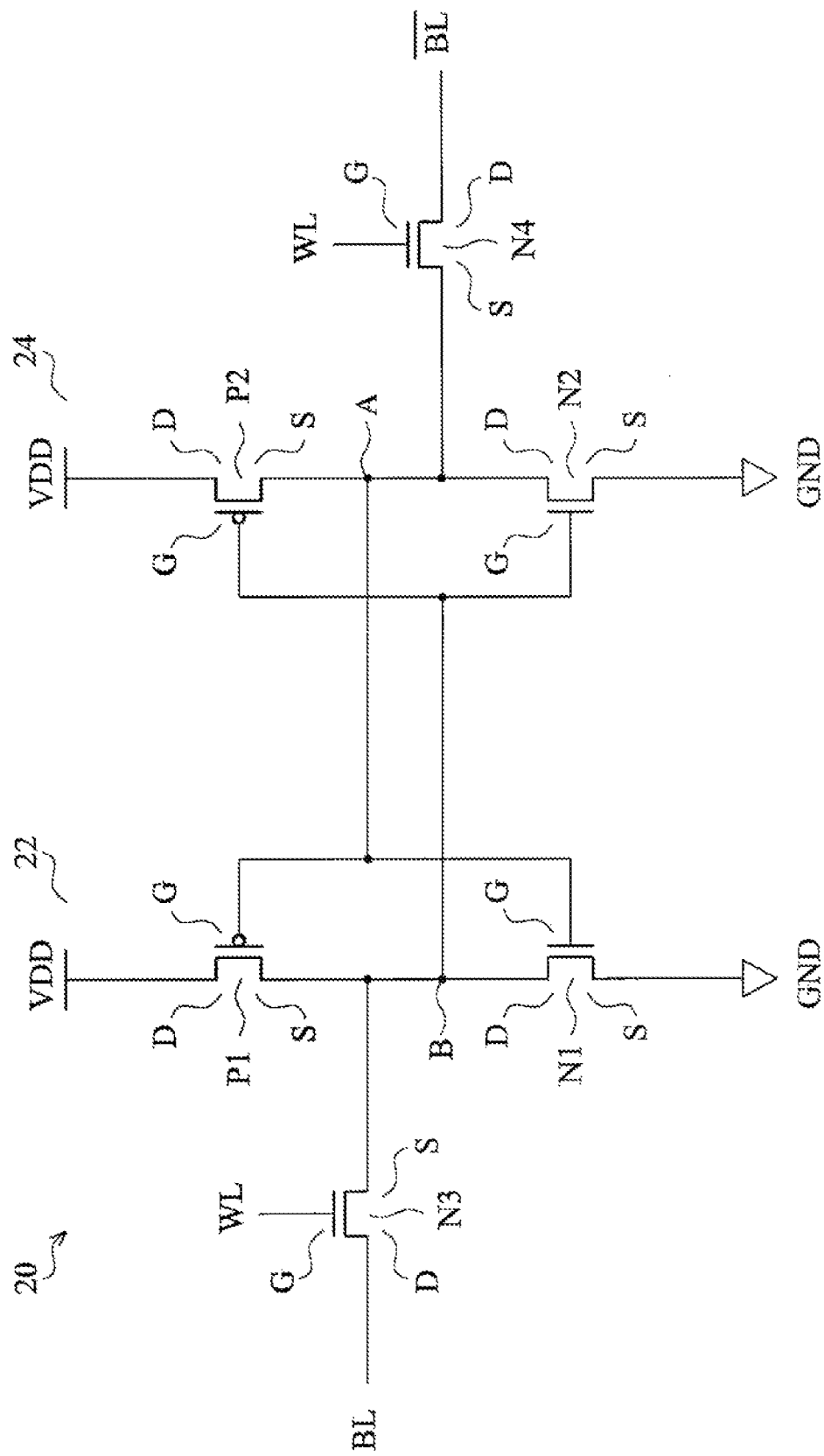
FIG. 8A shows a schematic diagram of a prior art six transistor SRAM unit cell.

In another embodiment, the embodied contact structures described above are employed in forming a six MOS transistor SRAM unit cell in an advanced technology. FIG. 8A shows a schematic diagram of a prior art six transistor SRAM unit cell 20. In SRAM cell 20, first inverter 22, comprising PMOS pull-up transistor P1 and NMOS pull-down transistor N1, is cross-coupled with second inverter 24, comprising pull-up PMOS transistor P2 and pull-down NMOS transistor N2. The source, drain and gate of each transistor is labeled with an "S," "D," or "G," respectively. The gate electrodes of P1 and N1 and the source regions of P2 and N2 make up a first storage node "A." The gate electrodes of P2 and N2 and the source regions of P1 and N1 make up a second storage node "B." The drains of P1 and P2 and the drains of N1 and N2 are coupled to a supply voltage, Vdd and ground, GND, respectively. During operation, data is written into SRAM cell 20 by first activating the wordline WL coupled to access transistors N3 and N4. Subsequently, the digital bit carried on the bitline BL will be passed to the second storage node "B" and the complementary bit on the bitline BL/ will be passed to the first storage node "A." This state will be held until new data is applied on access transistors N3 and N4.

Figure 8B:
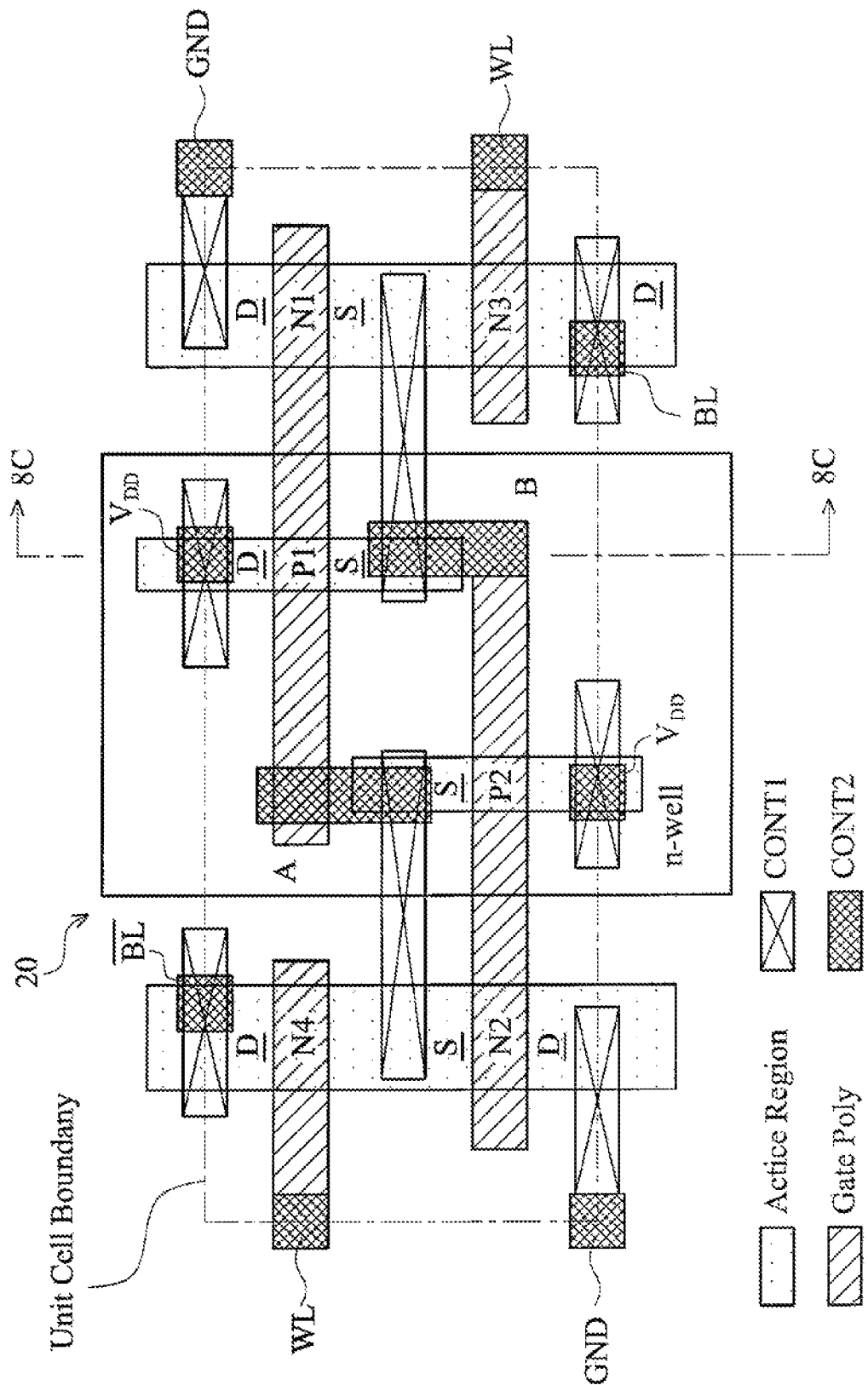
FIG. 8B shows a layout view of an embodied six transistor SRAM unit cell according to the principles of one embodiment of the current invention.
Figure 8C:
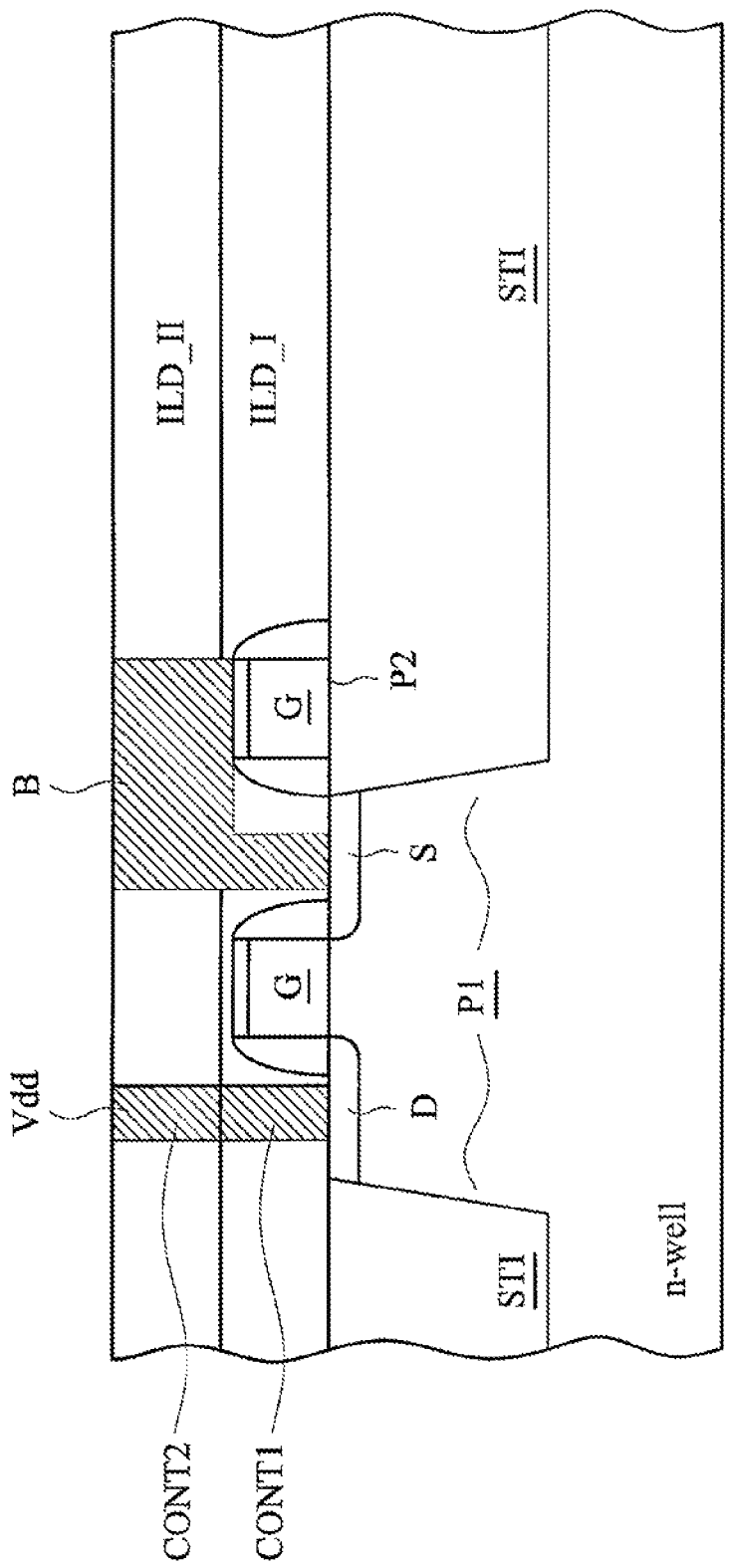
FIG. 8C shows a cross sectional view of an embodied six transistor SRAM unit cell according to the principles of one embodiment of the current invention.

FIG. 8B shows a layout view of six transistor SRAM unit cell 20 embodying the contact structures configured according to the principles of the embodiment of the present invention. Each of the regions has been labeled to correspond to the schematic diagram of FIG. 8A. FIG. 8C illustrates a cross-sectional view of the SRAM unit cell in the area noted in FIG. 8B. FIG. 8C shows how the supply voltage, Vdd is electrically coupled to drain region D of P1, and how the BTC contact is used at the second storage node "B" to electrically couple source region S of P1, source region S of N1 (not shown), and gate electrode G of P2 and N2 (not shown).

As shown in FIGS. 8B-8C, the contact coupling the supply voltage, Vdd to drain region D of P1, comprises a square-shaped, minimum design-rule size contact, CONT2, formed in ILD_II, stacking on a rectangular-shaped contact, CONT1, formed in ILD_I. CONT1 has a depth substantially the same as the gate electrode thickness and a width slightly smaller than the minimum design-rule contact dimension "λ" of CONT2. The BTC contact coupling source region S of P1, source region S of N1, and gate electrode G of P2 and N2 at the second storage node "B" comprises a rectangular-shaped contact, CONT1, formed in ILD_I, coupling source region S of P1 to source region S of N1, and a rectangular-shaped contact, CONT2, formed in ILD_II, coupling CONT1 to gate electrode G of P2 and N2. Illustrated in FIG. 8B, at the first storage node "A" and the second storage node "B," CONT1 also functions as a local bridge that couples the source regions of N2/P2 and N1/P1, respectively. The method of forming the contact structure in the embodiment described in FIGS. 8B and 8C is similar to those disclosed in previous preferred embodiments.

Figure 9:
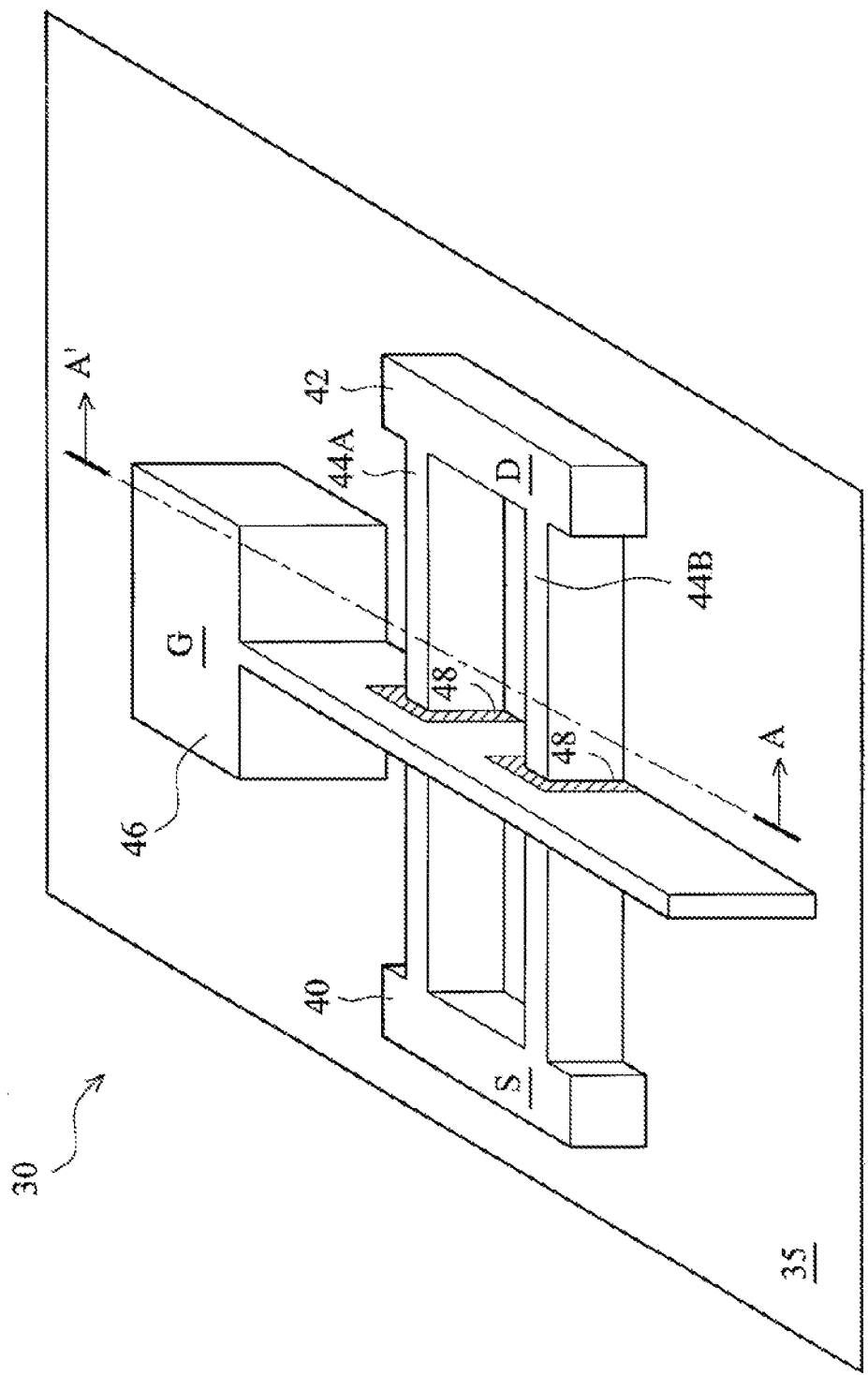
FIG. 9 is a perspective view of a prior art FinFET MOS transistor.

FIG. 9 shows a perspective view of a prior art FinFET MOS transistor 30. As is known in the art, FinFET MOS device 30 has a 3-D configuration when compared with the conventional planar MOS device configuration. FinFET structures are known as promising candidates for MOS devices in advanced technology because their configuration is known to suppress short channel effects and maintain desired drive current when the device dimension scales down to the nanometer range. In FIG. 9, FinFET MOS transistor 30, fabricated on an insulating substrate 35, includes silicon source island 40 and drain island 42 connected by two silicon fins (channels) 44A and 44B. Polysilicon gate 46 extends across channel fins 44A and 44B and is isolated therefrom by gate oxide 48. Channels 44A and 44B extend horizontally on substrate 35 with gate 46 in planes on either side of channels 44A and 44B, respectively.

In a further embodiment of the present invention, preferred contact structures described above are used to make electrical connections to prior art FinFET MOS transistor 30. A cross-sectional view of FinFET 30 in the area noted as A-A' in FIG. 9 is used below to illustrate how electrical contacts to FinFET MOS transistor 30 are made.

Figure 10A:
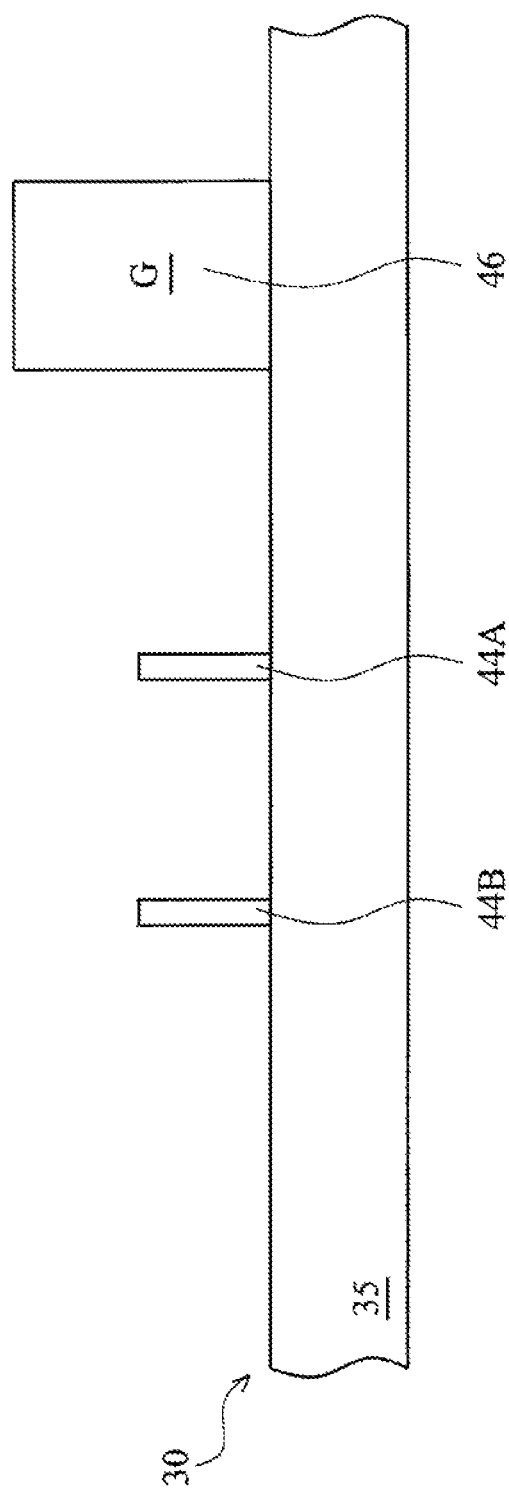
FIGS. 10A-10C show the cross sectional views of various processing steps in forming preferred contact structure to a FinFET MOS transistor according to the principles of one embodiment of the current invention.
Figure 10B:
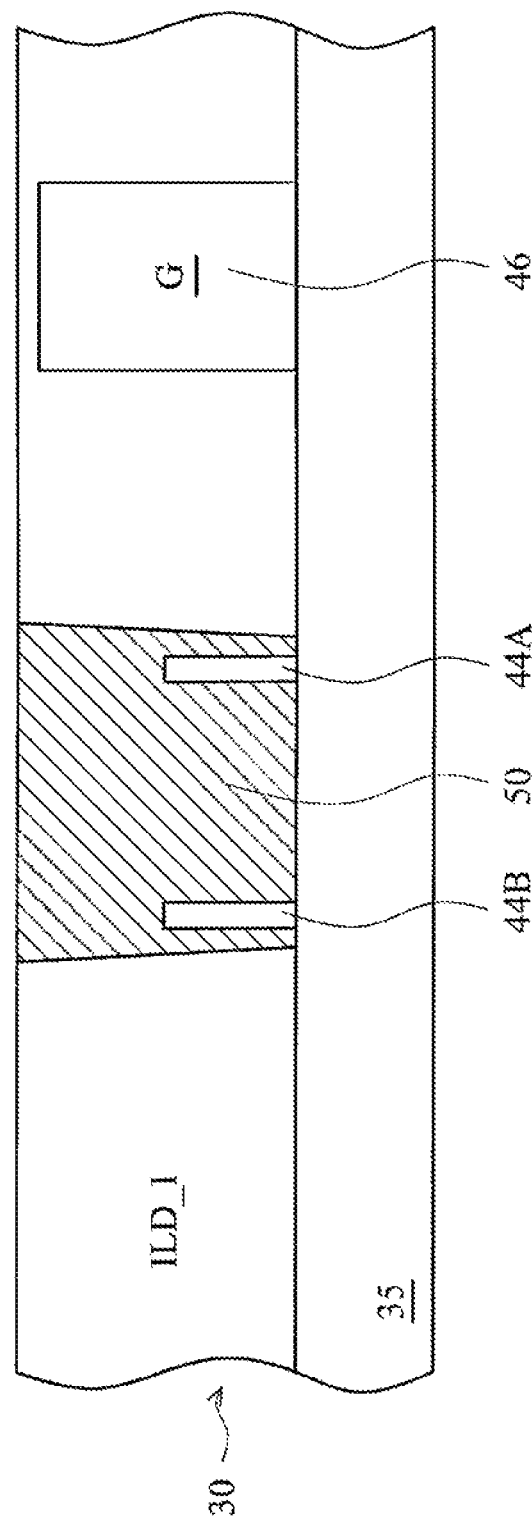
Figure 10C:
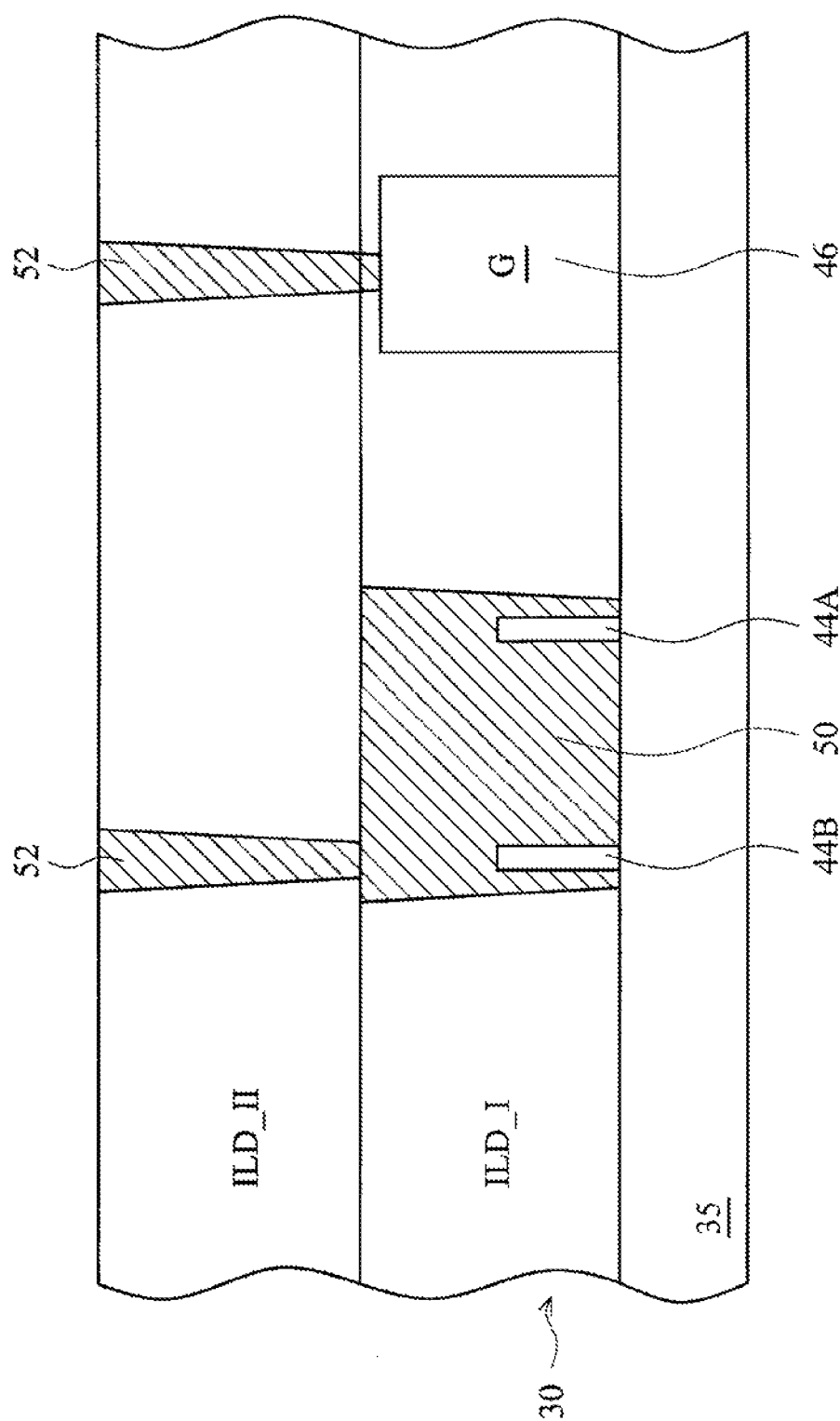

FIG. 10A shows the cross-sectional view of prior art FinFET 30, formed by known materials and processes on dielectric substrate 35. FinFET 30 comprises gate island 46 and two silicon channels 44A and 44B. Channels 44A and 44B are both connected to drain island 42 (shown in FIG. 9). FIGS. 10B-10C illustrate the steps of making contacts to FinFET 30. Shown in FIG. 10B, a first dielectric layer, ILD_I, is formed on substrate 35, having a thickness substantially the same as that of the gate island 46. In other alternative designs, the thickness of ILD_I may be approximately 50-100 Å thicker than the gate island 46. The thin ILD_I layer left on the top of gate island 46 acts as a protective layer, which prevents the underlying silicide layer (not shown) on gate island 46 from being damaged in the subsequent process steps. In further alternative designs, the thickness of ILD_I is such that contact openings formed therein have an aspect ratio less than 4:1. Subsequently, contact 50, coupling the silicon channels 44A and 44B on the drain 42 side, is formed in ILD_I through similar processes and materials used in forming CONT1 in the earlier disclosed embodiments. A similar contact coupling the silicon channels on source 40 side is simultaneously formed (not shown). In a preferred embodiment, contact 50 is made of tungsten, having a rectangular shape and a depth substantially the same as the height of gate island 46. In other preferred embodiments, contact 50 may be made of other suitable conductive contact materials, such as, Cu, W, Al, AlCu, TiN, TiW, Ti, TaN, Ta, other metal nitrides or any combination thereof.

Continuing in FIG. 10C, a second dielectric layer, ILD_II, is formed on the top of ILD_I, having a thickness about the same as that of ILD_I. In other embodiments, the thickness of ILD_II is less critical, so long as any contact openings created therein will not have an aspect ratio larger than 4:1. Then, contacts 52 with minimum design-rule size are formed in ILD_II, connecting to contact 50 and gate island 46. The processes and materials disclosed in previous embodiments in forming CONT2 can be used in the fabrication of contacts 52. In preferred embodiments, a conductive barrier layer (not show) such as a 50-100 Å layer of Ti (titanium), TiN (titanium nitride), Ta (tantalum), TaN (tantalum nitride), or the like may be formed by known processes on the bottom of contact 52 openings prior to the filling of contact metal. A barrier layer thus formed can prevent detrimental effects, such as metal diffusion and electromigration, as disclosed earlier.

Figure 11:
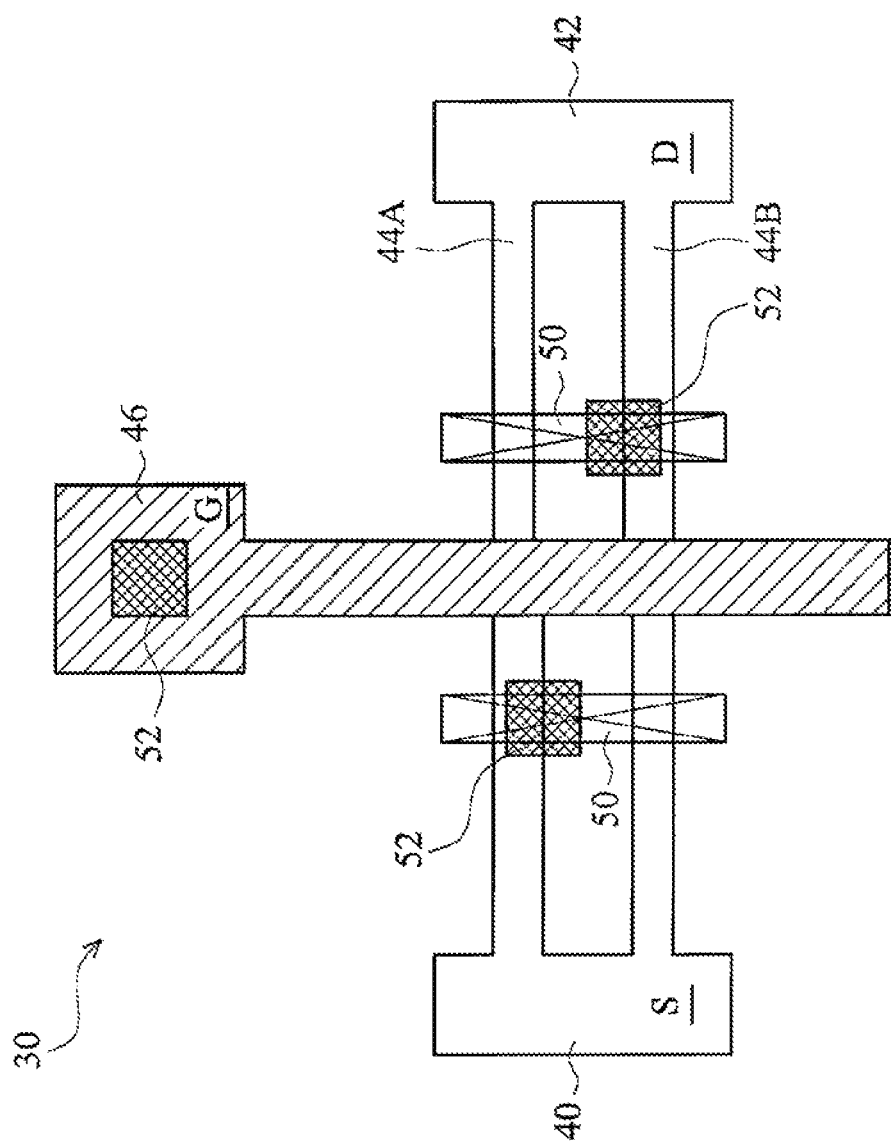
FIG. 11 shows a layout view of a FinFET embodying a preferred contact structure according to the principles of one embodiment of the current invention.

FIG. 11 illustrates a layout view of the FinFET 30, where electrical connections to source/drain regions 40, 42 and gate island 46 have been made using preferred contact structures of the present invention. Advantageous features of the preferred FinFET contact structures and method of forming include, but are not limited to, the resolution of the problem of forming contacts to a substrate with significant surface topology, such as the 3-D FinFET transistor MOS 30. Also, contact openings in ILD_I are only made to the source/drain regions 40, 42, thereby lowering contact density. This and the smaller contact opening aspect ratio in ILD_II enable a significantly improved etch processing window. Moreover, contact density in ILD_II is also significantly reduced, because smaller contact 52 in ILD_II can be placed in contact with large-size source/drain contact 50 in ILD_I.

Although the present invention and its advantages have been described in detail, it should be understood that various changes, substitutions and alterations can be made herein without departing from the spirit and scope of the invention as defined by the appended claims. For example, in another embodiment, low k (dielectric contact) materials are used for ILD_I and ILD_II in order to reduce parasitic capacitance, which in turn reduces signal RC delays and enhances signal integrity in an IC. In yet another embodiment, prior to the formation of ILD_I on a substrate in an SOC (system-on-chip) configuration, a silicon nitride strain-induced layer having a thickness more than three times the MOS transistor channel length is formed on the MOS transistors in the logical region. This, combining with the preferred contact structure, significantly increases the transistor drive current, thus enhances circuit performance. As another example, it will be readily understood by those skilled in the art that materials, process steps, process parameters in forming the preferred embodiments may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
    forming a first gate stack and a second gate stack over a semiconductor substrate, wherein the first gate stack includes a gate dielectric layer physically contacting the semiconductor substrate, wherein a sidewall spacer is disposed along the first gate stack and physically contacts the gate dielectric layer;
    forming a source/drain feature in the semiconductor substrate, wherein the source/drain feature is associated with the first gate stack and the sidewall spacer physically contacts the source/drain feature;
    forming a first interlayer dielectric layer over the first and second gate stacks;
    forming a first contact within the first interlayer dielectric layer such that the first contacts extends to the source/drain feature, wherein a length of the first contact is larger than a width of the first contact, and wherein the length is in a direction parallel to a channel width direction of the first gate stack and the width is in a direction perpendicular to the channel width direction of the first gate stack;
    forming a second interlayer dielectric layer over the first and second gate stacks; and
    forming a second contact within the second interlayer dielectric layer, wherein the second contact has a bottom surface physically contacting the first contact that extends continuously to physically contact the first gate stack, wherein the bottom surface of the second contact faces the semiconductor substrate and physically contacts the first interlayer dielectric layer and the sidewall spacer, wherein a length of the second contact is in the direction parallel to the channel width direction of the first gate stack and wherein the length of the first contact is larger than the length of the second contact.

2. The method of claim 1, further comprising forming a third contact within the second interlayer dielectric layer that extends to the second gate stack.

3. The method of claim 1, wherein forming the first contact within the first interlayer dielectric layer such that the first contacts extends to the source/drain feature includes:
    removing a portion of the first interlayer dielectric layer to form a trench that exposes the source/drain feature;
    forming a conductive feature within the trench; and
    planarizing a top surface of the conductive feature.

4. The method of claim 1, wherein forming the second contact within the second interlayer dielectric layer includes:
    removing a portion of the first and second interlayer dielectric layers to form a trench that exposes first gate stack;
    forming a conductive feature within the trench; and
    planarizing a top surface of the conductive feature.

5. The method of claim 1, further comprising forming a interconnect feature over the second contact, wherein the second contact is electrically connected to the interconnect feature.

6. The method of claim 1, wherein forming the first gate stack and the second gate stack over the semiconductor substrate includes forming the first gate stack directly over an isolation structure embedded within the semiconductor substrate.

7. The method of claim 1, further comprising forming a third contact within the first interlayer dielectric layer such that the first contacts extends to another source/drain feature associated with the second gate stack, wherein a length of the third contact is larger than a width of the third contact, wherein the length of the third contact is in the direction parallel to a channel width direction of the second gate stack and the width of the third contact is in the direction perpendicular to the channel width direction of the second gate stack.

8. A method comprising:
    forming a first gate stack over a semiconductor substrate, wherein the first gate stack includes a gate dielectric layer, wherein a sidewall spacer is disposed along the first gate stack and physically contacts the gate dielectric layer;
    forming a first source/drain feature in the semiconductor substrate, wherein the first source/drain feature is associated with the first gate stack;
    forming a first contact over the first source/drain feature, wherein a length of the first contact is larger than a width of the first contact, and wherein the length is in a direction parallel to a channel width direction of the first gate stack and the width is in a direction perpendicular to the channel width direction of the first gate stack; and
    forming a second contact over the first contact and the first gate stack, wherein the second contact has a bottom surface physically contacting the first contact that extends continuously to physically contact the first gate stack, wherein the bottom surface of the second contact faces the semiconductor substrate and physically contacts the sidewall spacer, wherein a length of the second contact is in the direction parallel to the channel width direction of the first gate stack and wherein the length of the first contact is larger than the length of the second contact.

9. The method of claim 8, wherein the first contact has a rectangular shaped from a top view.

10. The method of claim 8, further comprising forming an isolation structure in the semiconductor substrate, wherein the first gate stack is disposed over and physically contacts the isolation structure.

11. The method of claim 8, further comprising forming a first dielectric layer over the first gate stack; and forming a second dielectric layer over the first dielectric layer, wherein the first contact extends from the first/source drain feature in the first dielectric layer without extending beyond the first dielectric layer.

12. The method of claim 11, wherein the second contacts extends through the first and second dielectric layers.

13. The method of claim 8, further comprising forming a second source/drain feature in the semiconductor substrate; and forming a third contact over the second source/drain feature, wherein a length of the third contact is larger than a width of the third contact, wherein the length of the third contact is in the direction parallel to the channel width direction of the first gate stack and the width of the third contact is in the direction perpendicular to the channel width direction of the first gate stack.

14. The method of claim 13, further comprising forming a second gate stack over the semiconductor substrate, wherein the second source/drain feature is associated with the second gate stack.

15. A device comprising:
a first gate stack disposed over a semiconductor substrate, wherein the first gate stack includes a gate dielectric layer, wherein a sidewall spacer is disposed along the first gate stack and physically contacts the gate dielectric layer;
a first source/drain feature disposed within the semiconductor substrate and associated with the first gate stack, wherein the sidewall spacer physically contacts the first source/drain feature;
a first contact disposed over the first source/drain feature, wherein a length of the first contact is larger than a width of the first contact, and wherein the length is in a direction parallel to a channel width direction of the first gate stack and the width is in a direction perpendicular to the channel width direction of the first gate stack; and
a second contact disposed over the first contact and the first gate stack, wherein the second contact has a bottom surface physically contacting the first contact that extends continuously to physically contact the first gate stack, wherein the bottom surface of the second contact faces the semiconductor substrate and physically contacts the sidewall spacer, wherein a length of the second contact is in the direction parallel to the channel width direction of the first gate stack and wherein the length of the first contact is larger than the length of the second contact.

16. The device of claim 15, further comprising a second/drain feature disposed within the semiconductor substrate; and a third contact formed disposed over the second source/drain feature, wherein a length of the third contact is larger than a width of the third contact, and wherein the length is in a direction parallel to a channel width direction of the first gate stack and the width is in a direction perpendicular to the channel width direction of the first gate stack.

17. The device of claim 16, further comprising a fourth contact disposed over the third contact, wherein a length of the fourth contact is about equal to a width of the fourth contact, wherein the length of the fourth contact is in the direction parallel to the channel width direction of the first gate stack and the width of the fourth contact is in the direction perpendicular to the channel width direction of the first gate stack.

18. The device of claim 17, further comprising a second gate stack, wherein the second/source drain feature is associated with the second gate stack.

19. The device of claim 15, further comprising a first dielectric layer disposed over the first gate stack and a second dielectric layer disposed over the first dielectric layer, wherein the first contact extends through the first dielectric layer and the second contact extends through the first and second dielectric layers.

20. The device of claim 15, further comprising an interconnect feature disposed over and electrically connected to the second contact.

* * * * *